United States Patent
Pan et al.

(10) Patent No.: US 9,090,451 B1
(45) Date of Patent: Jul. 28, 2015

(54) MICROELECTROMECHANICAL RESONATORS HAVING OFFSET [100] AND [110] CRYSTAL ORIENTATIONS

(71) Applicant: Integrated Device Technology, Inc., San Jose, CA (US)

(72) Inventors: Wanling Pan, San Jose, CA (US); Harmeet Bhugra, San Jose, CA (US); Maryam Ziaei-Moayyed, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 117 days.

(21) Appl. No.: 13/837,854

(22) Filed: Mar. 15, 2013

Related U.S. Application Data

(63) Continuation-in-part of application No. 13/435,817, filed on Mar. 30, 2012, now Pat. No. 8,680,931.

(60) Provisional application No. 61/756,309, filed on Jan. 24, 2013, provisional application No. 61/764,307, filed on Dec. 13, 2013.

(51) Int. Cl.
| | |
|---|---|
| H03B 5/32 | (2006.01) |
| H01L 41/08 | (2006.01) |
| B81B 3/00 | (2006.01) |
| H01L 41/083 | (2006.01) |

(52) U.S. Cl.
CPC ............ *B81B 3/0021* (2013.01); *H01L 41/083* (2013.01)

(58) Field of Classification Search
CPC ........ H03B 5/32; H01L 41/08; H01L 41/083; B81B 3/002; B81B 3/00
USPC ........................... 331/107 R, 116 R, 154, 158
See application file for complete search history.

(56) References Cited

U.S. PATENT DOCUMENTS

| | | |
|---|---|---|
| 2,998,575 A | 8/1961 | Mason |
| 3,683,213 A | 8/1972 | Staudte |
| 4,719,383 A | 1/1988 | Wang et al. |
| 5,132,643 A | 7/1992 | Ueno et al. |
| 5,329,256 A | 7/1994 | Higgins, Jr. |

(Continued)

OTHER PUBLICATIONS

Abdolvand et al., "Thin-Film Piezoelectic-on-Silicon Resonators for High-Frequency Reference Oscillator Applications", IEEE Transactions on Ultrasonics, Ferroelectrics, and Frequency Control, vol. 55, No. 12, Dec. 2008, pp. 2596-2606.

(Continued)

*Primary Examiner* — Joseph Chang
*Assistant Examiner* — Jeffrey Shin
(74) *Attorney, Agent, or Firm* — Myers Bigel, et al.

(57) ABSTRACT

A TPoS resonator includes a substrate and a resonator body suspended over the substrate by at least a first pair of fixed supports (e.g., tethers) that attach to first and second ends of the resonator body. The resonator body includes monocrystalline silicon, which has a [100] crystallographic orientation that is offset by ±α degrees relative to a nodal line of the resonator body (e.g., tether-to-tether axis) when the resonator body is operating at a resonant frequency, where a is a real number in a range from about 5 to about 19 and, more preferably, in a range from about 7 to about 17. The resonator may be an extensional-mode resonator and the resonator body may be rectangular-shaped with unequal length and width dimensions.

6 Claims, 19 Drawing Sheets

(56) References Cited

U.S. PATENT DOCUMENTS

| | | | |
|---|---|---|---|
| 5,585,770 | A | 12/1996 | Higgins, Jr. |
| 6,320,474 | B1 | 11/2001 | Kamiya et al. |
| 6,909,221 | B2 | 6/2005 | Ayazi et al. |
| 7,492,241 | B2 | 2/2009 | Piazza et al. |
| 7,639,105 | B2 | 12/2009 | Ayazi et al. |
| 7,791,432 | B2 | 9/2010 | Piazza et al. |
| 7,800,282 | B2 | 9/2010 | Ayazi et al. |
| 7,843,284 | B2 | 11/2010 | Ayazi et al. |
| 7,888,843 | B2 | 2/2011 | Ayazi et al. |
| 7,893,784 | B2 | 2/2011 | Hirama |
| 7,915,974 | B2 | 3/2011 | Piazza et al. |
| 7,924,119 | B1 | 4/2011 | Ayazi et al. |
| 7,939,990 | B2 | 5/2011 | Wang et al. |
| 7,955,885 | B1 | 6/2011 | Bhugra et al. |
| 8,022,779 | B2 | 9/2011 | Ayazi et al. |
| 8,061,013 | B2 | 11/2011 | Ayazi et al. |
| 8,063,720 | B2 | 11/2011 | Ayazi et al. |
| 8,106,724 | B1 | 1/2012 | Wang et al. |
| 8,558,643 | B2 | 10/2013 | Prunnila et al. |
| 2006/0273867 | A1 | 12/2006 | Piazza et al. |
| 2006/0290449 | A1 | 12/2006 | Piazza et al. |
| 2009/0072663 | A1* | 3/2009 | Ayazi et al. ............... 310/320 |
| 2009/0108959 | A1 | 4/2009 | Piazza et al. |
| 2009/0144963 | A1 | 6/2009 | Piazza et al. |
| 2010/0117750 | A1* | 5/2010 | Fry et al. ............... 331/162 |
| 2011/0279201 | A1 | 11/2011 | Pensala et al. |
| 2013/0077898 | A1* | 3/2013 | Doll et al. ............... 383/202 |

OTHER PUBLICATIONS

Kim et al., "Capacitive Frequency Tuning of ALM Micromechanical Resonators", Transducers 2011, Beijing, China, Jun. 5-9, 2011, pp. 502-505.

Piazza et al., "One and Two Port Piezoelectric Contour-Mode MEMS Resonators for Frequency Synthesis", Proceedings of the 36$^{th}$ European Solid-State Device Research Conference, Sep. 2006, pp. 182-185.

Piazza et al., "Piezoelectric Aluminum Nitride Vibrating Contour-Mode MEMS Resonators", Journal of Microelectrochemical Systems, vol. 15, Issue 6, Dec. 2006, pp. 1406-1418.

Pourkamali et al., "Low-Impedance VHF and UHF Capacitive Silicon Bulk Acoustic Wave Resonators—Part I: Concept and Fabrication," IEEE Trans. on Electron Devices, vol. 54, No. 8, pp. 2017-2023, Aug. 2007.

Samarao et al., "Intrinsic Temperature Compensation of Highly Resistive High-Q Silicon Microresonators via Charge Carrier Depletion", Frequency Control Symposium (FCS), Newport Beach, California, 2010 IEEE International, Jun. 1-4, 2010, pp. 334-339.

Shahmohammadi et al., "Low Jitter Thin-Film Piezoelectric-on-Substrate Oscillators", Proceedings IEEE International Frequency Control Symposium (IFCS), Newport Beach, California, Jun. 1-4, 2010, pp. 613-617.

Shahmohammadi et al., "Passive Tuning in Lateral-Mode Thin-Film Piezoelectric Oscillators", Proceedings 2011 Joint Conference of the IEEE International Frequency Control Symposium (IFCS 2011) and European Frequency and Time Forum (EFTF), San Francisco, California, May 2011, 5 pages.

Wang et al., Crystallographic influence on nanomechanics of (100)-oriented silicon resonators; Applied Physics Letters, vol. 83, No. 15, Oct. 13, 2003; pp. 3189-3191.

M Manzur Ul Islam [ID# 072190045] [Sec: 03], Difference between Silicon Wafer, <100> & <111>(Feb 5, 2010); 4 pages.

* cited by examiner

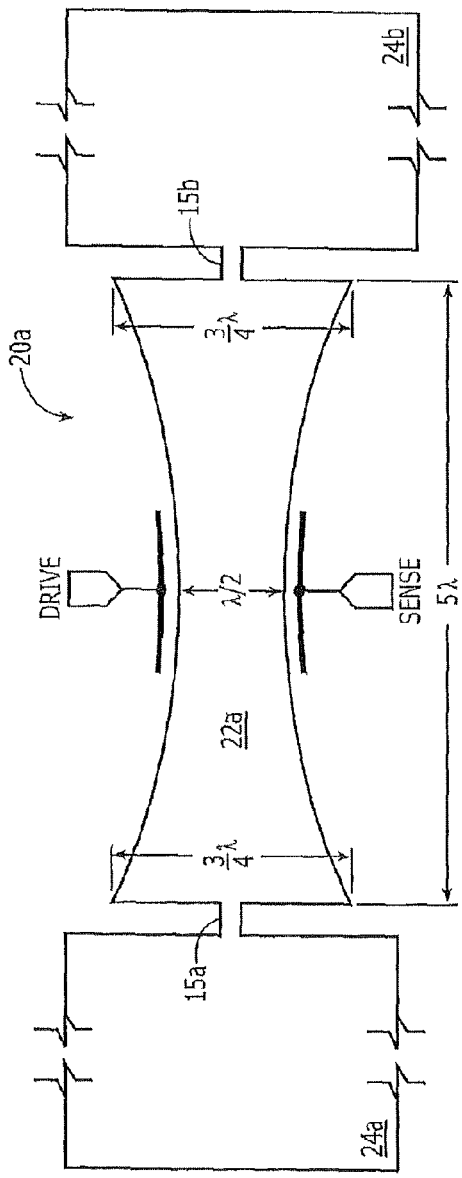
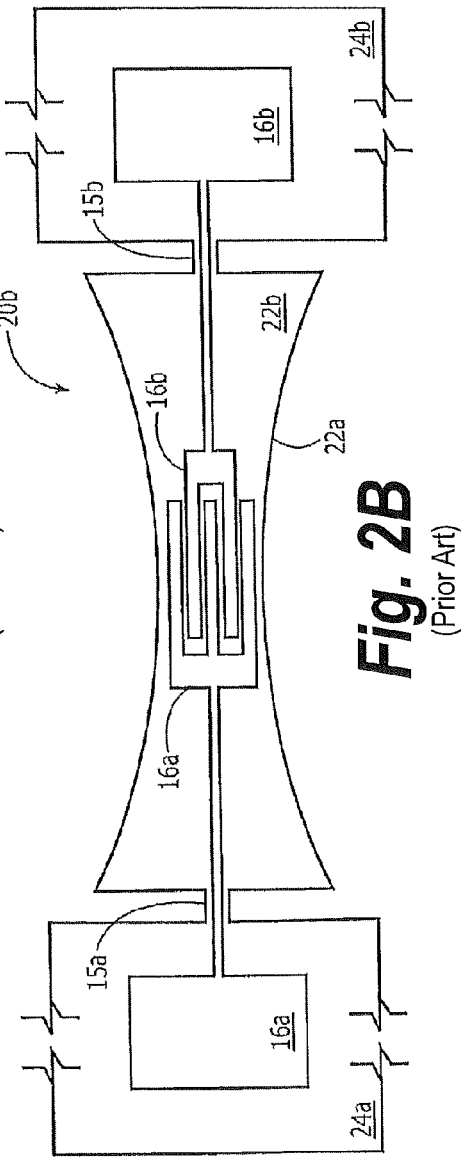

Surface mode, temperature = 40C
Freq=188.1MHz
Q=5629
IL=10.2dB

Bulk mode, temperature = 40C
Freq= 26.7MHz
Q=9120
IL=18.8dB

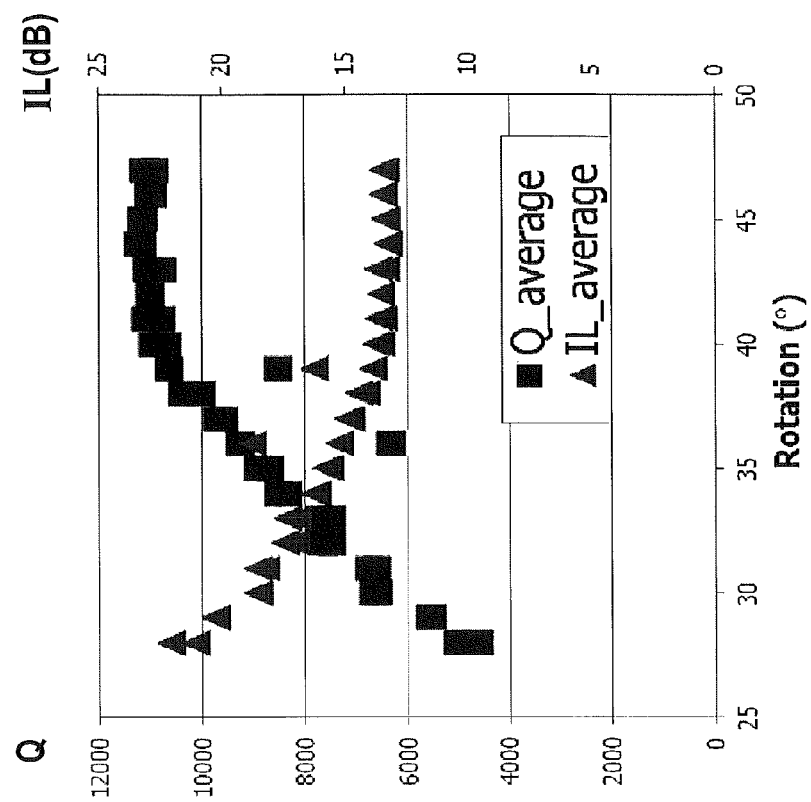
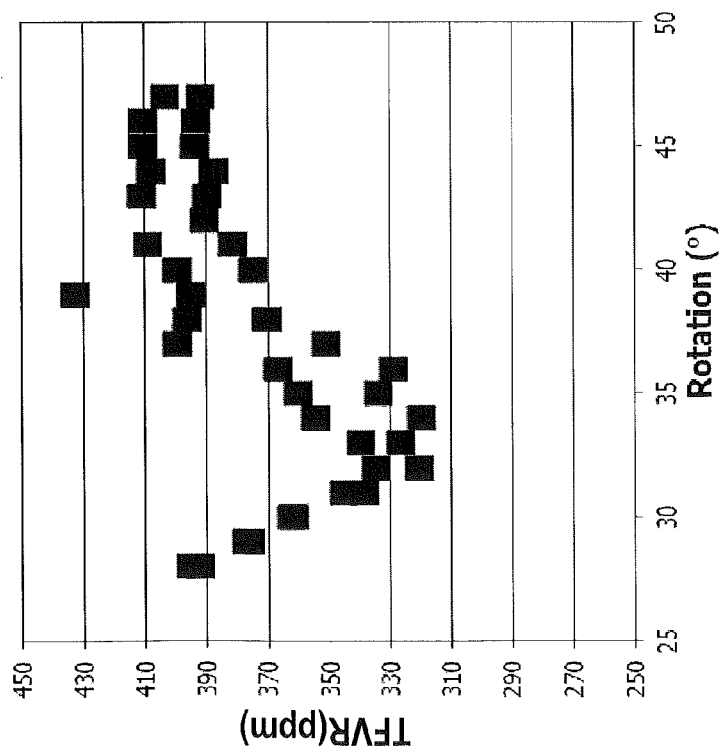
Fig. 12B
Fig. 12A

MICROELECTROMECHANICAL RESONATORS HAVING OFFSET [100] AND [110] CRYSTAL ORIENTATIONS

REFERENCE TO PRIORITY APPLICATION

This application is a continuation-in-part (CIP) of U.S. application Ser. No. 13/435,817, filed Mar. 30, 2012, now U.S. Pat. No. 8,680,931, and claims priority to U.S. Provisional Application Ser. Nos. 61/756,309, filed Jan. 24, 2013 and 61/764,307, filed Feb. 13, 2013, the disclosures of which are hereby incorporated herein by reference.

CROSS-REFERENCE TO RELATED APPLICATION

This application is related to U.S. application Ser. No. 13/186,332, filed Jul. 19, 2011, now U.S. Pat. No. 8,742,854, the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMS) resonators can provide small form factor, ease of integration with conventional semiconductor fabrication techniques and high f·C products. High frequency and high-Q width-extensional mode silicon bulk acoustic resonators (SiBARs) and film bulk acoustic wave resonators (FBARs) have demonstrated atmospheric quality factors (Q) in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

Unfortunately, such resonators may be characterized by relatively high temperature coefficient of frequency (TCF) values that require active compensation using temperature compensation circuits and/or relatively complex fabrication techniques to reduce TCF. Circuit-based compensation techniques typically increase the complexity of a resonator device and increase power consumption. Alternatively, fabrication-based compensation techniques that reduce TCF may cause a reduction in resonator quality factor (Q) and/or increase in resonator insertion loss. Examples of resonators that may use active and/or passive temperature compensation techniques are disclosed in U.S. Pat. Nos. 7,800,282, 7,843,284, 7,888,843, 7,924,119, 7,939,990, 7,955,885, 8,022,779, 8,061,013, 8,063,720 and 8,106,724, the disclosures of which are hereby incorporated herein by reference.

FIG. 2A illustrates a capacitive-type concave bulk acoustic resonator (CBAR) 20a, which is disclosed more fully in U.S. Pat. No. 8,063,720 to Ayazi et al, the disclosure of which is hereby incorporated herein by reference. The CBAR 20a includes a resonator body 22a (e.g., silicon) that is suspended opposite a recess (not shown) within a substrate 24a, 24b by a pair of opposing supports/tethers 15a, 15b located at opposite ends of the resonator body 22a. In contrast to the conventional bulk acoustic resonator 10 of FIG. 1, which includes a rectangular-shaped resonator body 12 suspended opposite a recess (not shown) in a substrate 14a, 14b, the CBAR 20a includes opposing concave-shaped sides. These sides curve inward relative to each other so that a minimum spacing at a center of the resonator body 22a is $\lambda/2$, where $\lambda$ is a wavelength associated with a resonant frequency of the resonator body 22a.

As further illustrated by FIG. 2A, a drive electrode (DRIVE) extends adjacent the first concave-shaped side of the resonator body 22a and a sense electrode (SENSE) extends adjacent a second concave-shaped side of the resonator body 22a. In contrast to the resonator 10 of FIG. 1, the width of the drive electrode (and sense electrode) as measured along the first concave-shaped side of the resonator body 22a is less than a spacing ($5\lambda$) between the first and second ends of the resonator body 22a. In particular, the width of the drive electrode as measured along the first concave-shaped side is preferably less than one-half a spacing between the first and second ends of the resonator body 22a and, more preferably, less than one-third a spacing between the first and second ends of the resonator body 22a. Moreover, when the widths of the first and second ends of the resonator body 22a are equal to $3\lambda/4$, as illustrated by FIG. 2A, the opposing ends will not support acoustic energy at the resonant frequency determined by the central width $\lambda/2$. Accordingly, because of the concave shape of the sides extending adjacent the drive and sense electrodes, the resonator 20a operates to concentrate acoustic energy near the central width $\lambda/2$ of the resonator body 22a and thereby supports a high quality (Q) of the resonator 20a by reducing acoustic losses at the relatively narrow supports 15a, 15b.

The concave-shaped resonator body 22a of the capacitive-type resonator 20a of FIG. 2A may be utilized within a piezoelectric-type resonator 20b of FIG. 2B. This resonator 20b is illustrated as including a piezoelectric layer 22b (e.g., ZnO) on a resonator body 22a (e.g., silicon) and first and second interdigitated electrodes 16a, 16b on the piezoelectric layer 22b. These electrodes 16a and 16b are patterned to include a plurality of finger-like extensions that operate to concentrate acoustic energy near the center of the resonator body 22a. As illustrated by FIG. 2C, the embodiments of FIGS. 2A and 2B may be combined to yield a concave bulk acoustic resonator (CBAR) 20c that supports both capacitive and piezoelectric transduction using electrostatic drive and sense electrodes and interdigitated electrodes 16a, 16b.

A comparison of the TCF characteristics of the SiBAR of FIG. 1 versus the TCF characteristics of the CBAR of FIG. 2A is provided by FIG. 3. As illustrated by FIG. 3, a 100 MHz CBAR of FIG. 2A may exhibit a TCF of −6.31 ppm/° C., which is significantly lower than the TCF of −21.46 ppm/° C. of an otherwise equivalent 100 MHz SiBAR having a rectangular-shaped resonator body. These resonators were fabricated on the same boron-doped p-type silicon with a starting resistivity of about 0.001 Ω-cm. As illustrated by FIG. 4, the measured response of the CBAR in vacuum demonstrates a Q of 101,550 at 104.92 MHz and an fQ product of $1.06 \times 10^{13}$.

One example of the CBAR 20c of FIG. 2C is more fully described in an article by Samarao et al., entitled 'Combined Capacitive and Piezoelectric Transduction for High Performance Silicon Microresonators,' MEMS 2011, Cancun, Mexico, January 23-27 (2011), pp. 169-172, the disclosure of which is hereby incorporated herein by reference. As illustrated by the graph of FIG. 5B herein, which is taken from FIG. 9a of the Samarao et al. article, a geometrically engineered CP-CBAR may be operated in: (1) a capacitive-drive and capacitive-sense mode using a 20 Volt polarization voltage (Vp) (e.g., by removing a piezoelectric stack from the concave resonator body); (2) a piezoelectric-drive and piezoelectric-sense mode; (3) a capacitive/piezoelectric-drive and capacitive/piezoelectric-sense mode; and (4) a capacitive-drive and piezoelectric-sense mode. As evident by this graph, the third mode (3) demonstrates highly efficient resonance at multiple frequencies, with reduced acoustic losses caused by spurious signal generation relative to mode (2). In particular, the third mode (3) produces two peak signals between 98 and 102 MHz, which have temperature coefficients of frequency that differ by 10 ppm/°C. The experimental configurations of these modes are more fully illustrated by FIGS. 3c and 6 of the Samarao et al. article and in a dissertation by Ashwin K. Samarao, entitled "Compensation and Trimming for Silicon Micromechanical Resonators and Resonator Arrays for Timing and Spectral Processing," Dissertation Presented to the Academic Faculty, Georgia Institute of Technology, May 2011, published in depository archives on Jul. 6, 2011, pp. 1-132, the disclosures of which are hereby incorporated herein by reference.

SUMMARY OF THE INVENTION

A thin-film piezoelectric-on-silicon (TPoS) resonator according to some embodiments of the invention includes a substrate and a resonator body suspended over the substrate by at least a first pair of fixed supports (e.g., tethers) that attach to first and second ends of the resonator body. The resonator body includes monocrystalline silicon, which has a [100] crystallographic orientation that is offset by ±α degrees relative to a nodal line of the resonator body (e.g., tether-to-tether axis) when the resonator body is operating at a resonant frequency, where α is a real number in a range from about 5 to about 19 and, more preferably, in a range from about 7 to about 17. According to further embodiments of the invention, the resonator is an extensional-mode resonator, the resonator body is a rectangular-shaped resonator body having unequal length and width dimensions and the substrate is a [100] silicon-on-insulator substrate. According to still further embodiments of the invention, the monocrystalline silicon in the resonator body is doped with an N-type (or P-type) dopant to a level greater than about $1 \times 10^{19}$ cm$^{-3}$ and the resonator body has a thickness in a range from about 8 um to about 40 um. Lower and upper metal electrodes and an aluminum nitride layer may also be provided on the resonator body, and the aluminum nitride layer may extend between the lower and upper metal electrodes.

According to additional embodiments of the invention, a thin-film piezoelectric-on-silicon (TPoS) resonator may include a substrate and a resonator body suspended over the substrate by at least a first pair of fixed supports that attach to first and second ends of the resonator body. The resonator body is configured as a monocrystalline silicon body having [100] and [110] crystallographic orientations that are both offset relative to a nodal line (e.g., tether-to-tether axis) of the resonator body when the resonator body is operating at a resonant frequency. The monocrystalline silicon body may be doped (e.g., phosphorus doped) to a level greater than about $1 \times 10^{19}$ cm$^{-3}$ and the substrate may be configured as a [100] silicon-on-insulator substrate.

According to still further embodiments of the invention, a micro-electromechanical resonator may be configured to include a substrate and a resonator body suspended over the substrate by at least one support. This resonator body may include a monocrystalline semiconductor having [100] and [110] crystallographic orientations that are offset relative to a nodal line of the resonator body when the resonator body is operating at a resonant frequency. The monocrystalline semiconductor may be doped with an N-type or P-type dopant to a level greater than about $1 \times 10^{19}$ cm$^{-3}$. Lower and upper metal electrodes may also be provided on the resonator body and an aluminum nitride layer may be provided, which is sandwiched between the lower and upper metal electrodes.

BRIEF DESCRIPTION OF THE DRAWINGS

FIG. 2A is a plan view of a concave bulk acoustic resonator (CBAR) according to the prior art.

FIG. 2B is a plan view of a concave bulk acoustic resonator (CBAR) according to the prior art.

FIG. 12A is graph of total frequency variation range (TFVR) versus resonator alignment, according to embodiments of the present invention.

FIG. 12B is a graph of quality (Q) and insertion loss (IL) versus resonator alignment, according to embodiments of the present invention.

DETAILED DESCRIPTION OF EMBODIMENTS

Figure 1:
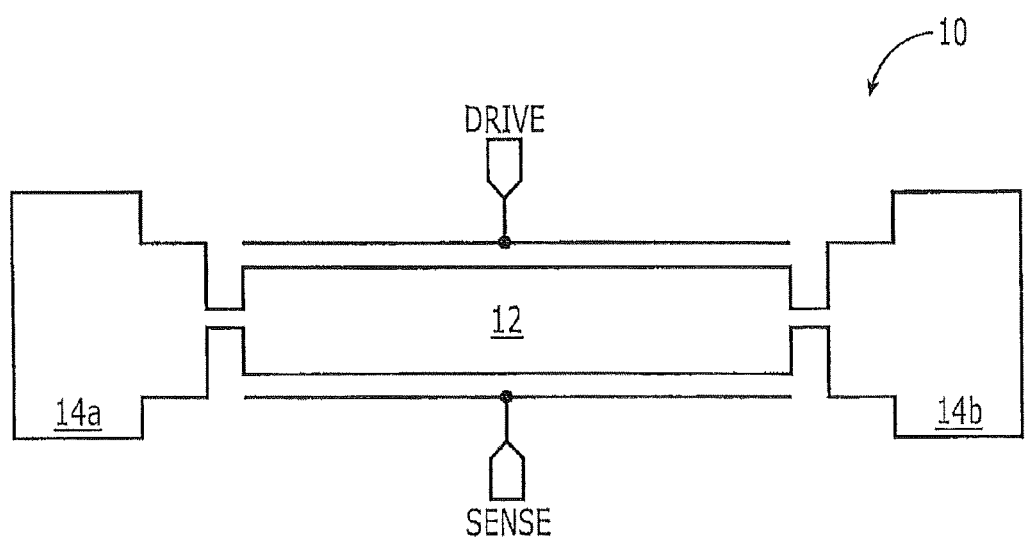
FIG. 1 is a plan view of a silicon bulk acoustic resonator (SiBAR) according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2C:
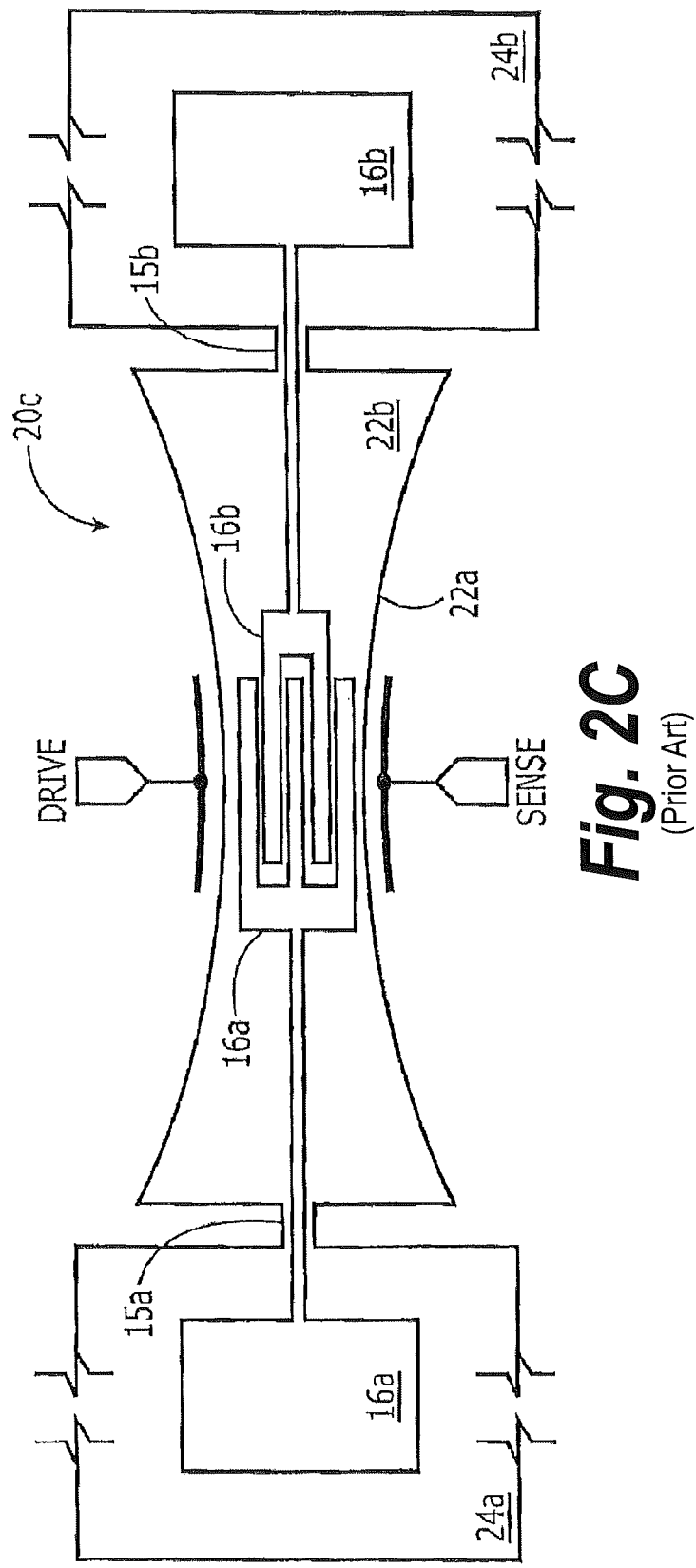
FIG. 2C is a plan view of a capacitively and piezoelectrically transduced concave bulk acoustic resonator (CP-CBAR) according to the prior art.
Figure 5A:
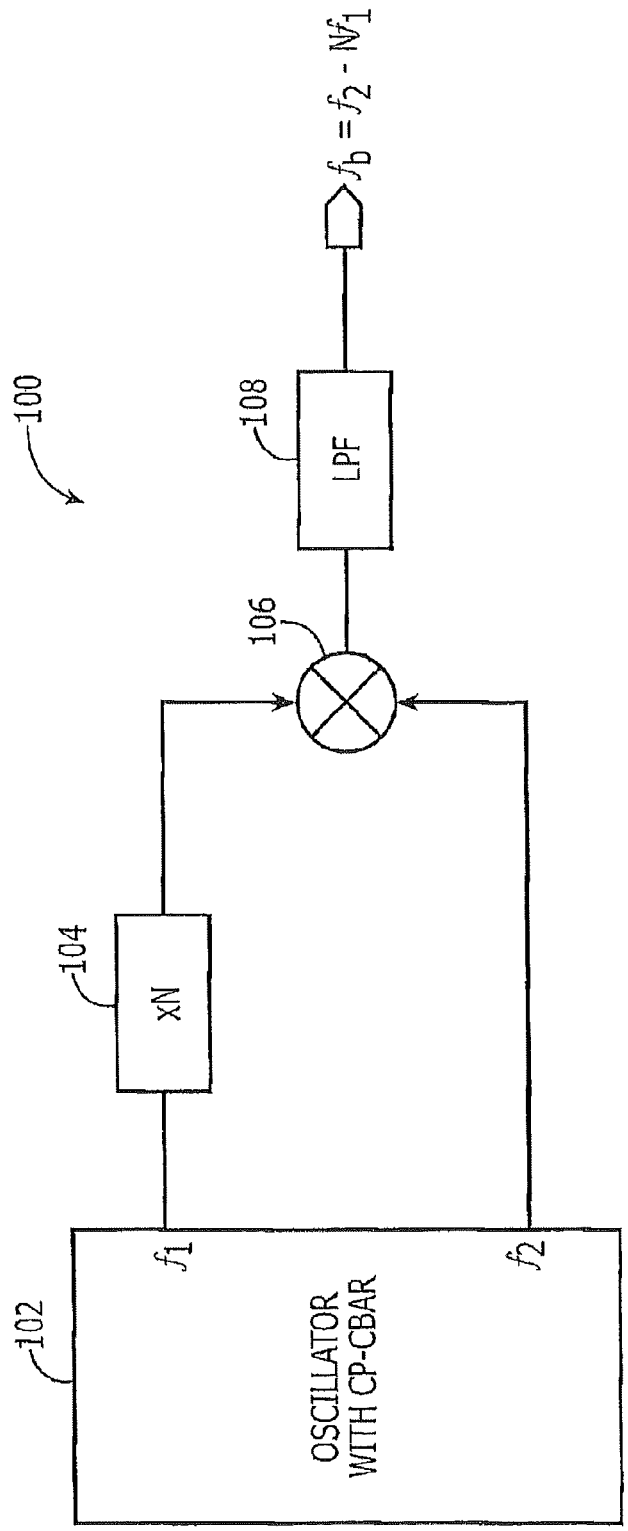
FIG. 5A is a block diagram of a periodic signal generator according to an embodiment of the present invention.
Figure 5B:
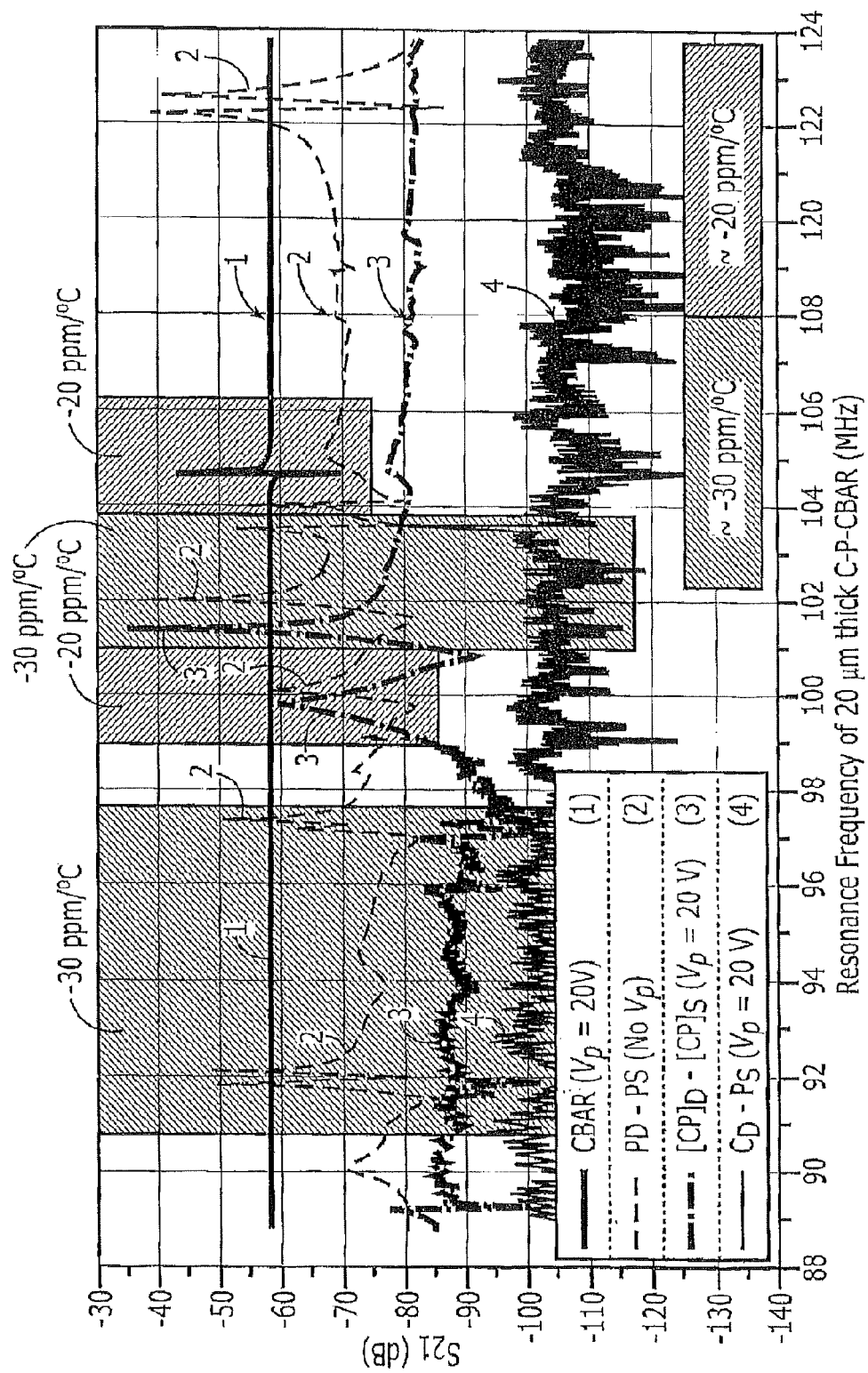
FIG. 5B is a graph illustrating resonant frequencies of a 20 um thick capacitively and piezoelectrically transduced concave bulk acoustic resonator (CBAR) when configured for: (1) capacitive drive and capacitive sense with a 20 Volt polarization voltage (without piezoelectric stack); (2) piezoelectric drive and piezoelectric sense without polarization voltage; (3) capacitive/piezoelectric drive and capacitive/piezoelectric sense with a 20 Volt polarization voltage; and (4) capacitive drive and piezoelectric sense with a 20 Volt polarization voltage.

As highlighted by FIG. 5A, a geometrically engineered resonator may be configured to yield multiple spaced-apart resonant frequency signals having substantially different temperature coefficients of frequency (e.g., −20 ppm/° C. and −30 ppm/° C.) when operating in at least one of the aforementioned modes. These aspects of the CP-CBAR of FIG. 2C

Figure 3:
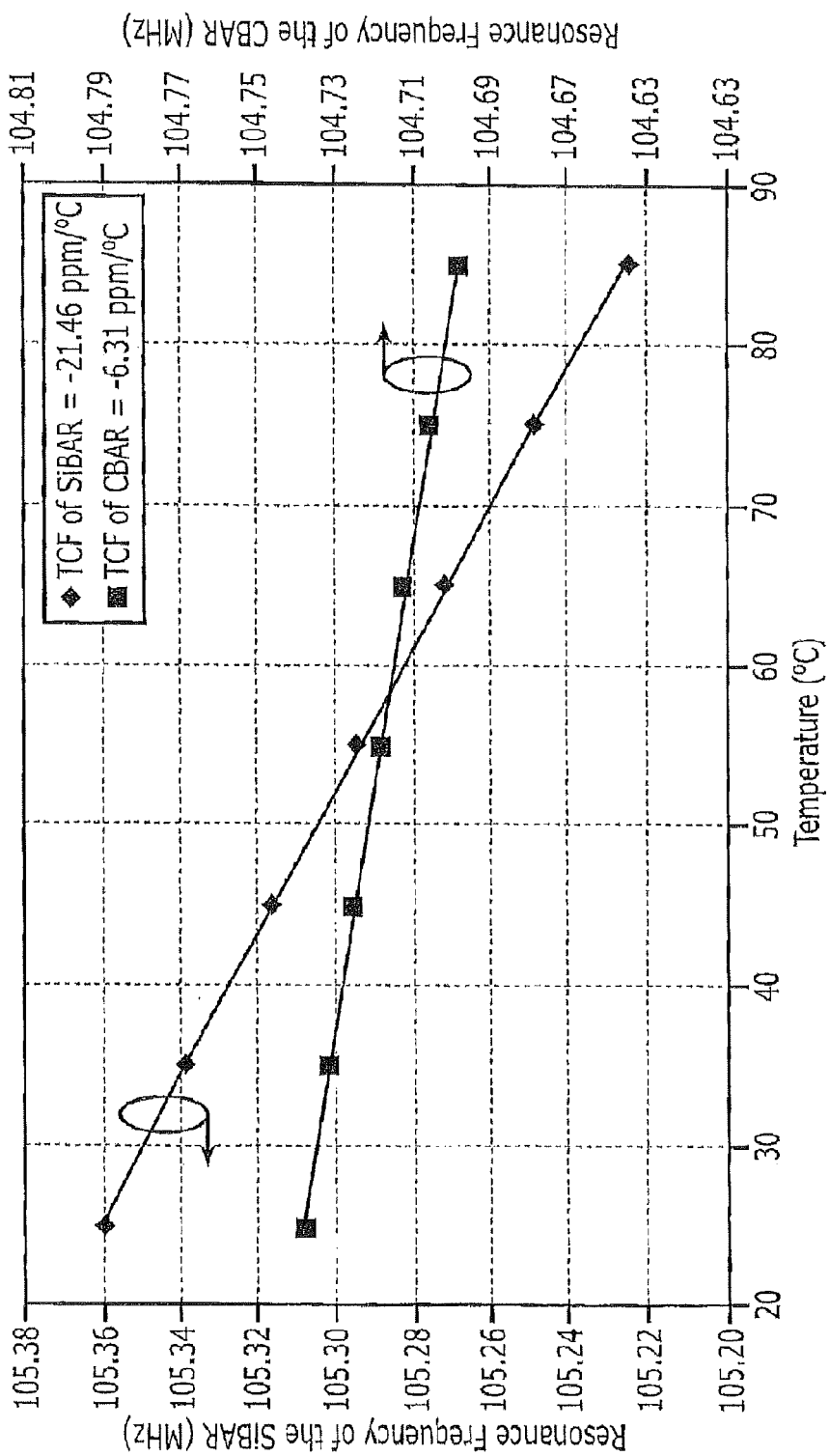
FIG. 3 includes a first graph of resonance frequency of the SiBAR of FIG. 1 versus temperature and a second graph of resonance frequency of the concave SiBAR of FIG. 2A versus temperature.

(and FIG. 3c of the Samarao et al. article) may be utilized within a periodic signal generator 100 containing an oscillator 102, which is configured to produce first and second periodic signals ($f_1$ and $f_2$) having unequal frequencies with unequal TCFs. The first periodic signal $f_1$ is provided to a multiplier circuit 104, which passes its output to a mixer circuit. This mixer circuit contains a mixer 106, which receives the output of the multiplier circuit 104 and the second periodic signal $f_2$, and a low pass filter 108. The multiplier circuit 104 and mixer circuit collectively form one embodiment of a signal processor that is responsive to the first and second periodic signals.

As will be understood by those skilled in the art, a difference signal generated at an output of the mixer 106 may be passed through a low pass filter 108 to thereby yield a beat signal $f_b$ having a frequency equal to $|f_2-Nf_1|$ and a temperature coefficient of frequency $TCf_b$ equal to $TCf_1+\mu_f(TCf_2-TCf_1)$, where $\mu_f=f_2/f_b$. According to additional embodiments of the invention, the generation of the beat signal $f_b$ may be used in applications relating to temperature sensing, such as those disclosed in an article by S. Schodowski entitled "Resonator Self-Temperature-Sensing Using a Dual-Harmonic-Mode Crystal Oscillator," 43$^{rd}$ Annual Symposium of Frequency Control, pp. 2-7 (1989).

Figure 5C:
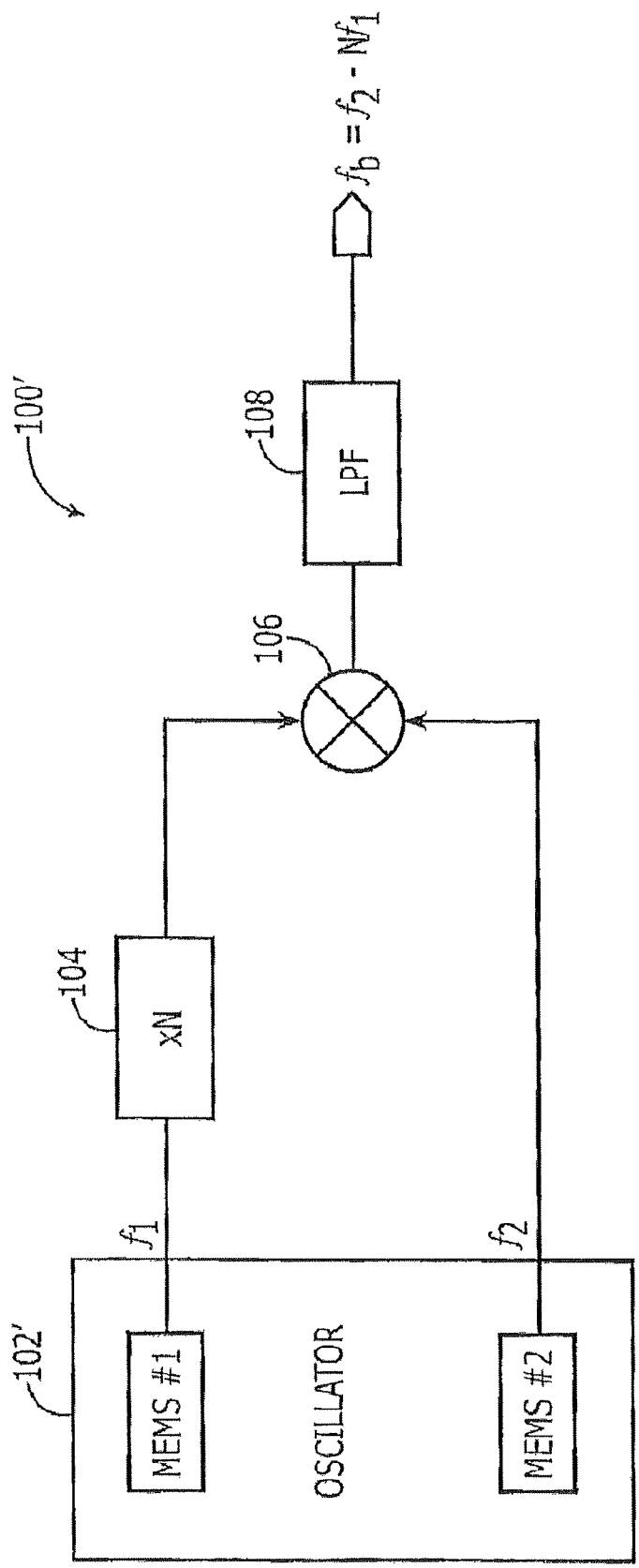
FIG. 5C is a block diagram of a periodic signal generator according to an additional embodiment of the present invention.

Alternatively, as illustrated by FIG. 5C, a periodic signal generator 100' may be provided, which contains an oscillator 102' having multiple MEMS resonators (MEMS #1, MEMS #2) therein. These resonators, which may be identical, are configured to produce respective first and second periodic signals ($f_1$ and $f_2$) having unequal frequencies with unequal TCFs. The first periodic signal $f_1$ is provided to a multiplier circuit 104, which passes its output to a mixer circuit. This mixer circuit contains a mixer 106, which receives the output of the multiplier circuit 104 and the second periodic signal $f_2$, and a low pass filter 108. As will be understood by those skilled in the art, a difference signal generated at an output of the mixer 106 may be passed through a low pass filter 108 to thereby yield a beat signal $f_b$ having a frequency equal to $|f_2-Nf_1|$ and a temperature coefficient of frequency $TCf_b$ equal to $TCf_1+\mu_f(TCf_2-TCf_1)$, where $\mu_f=f_2/f_b$.

Figure 4:
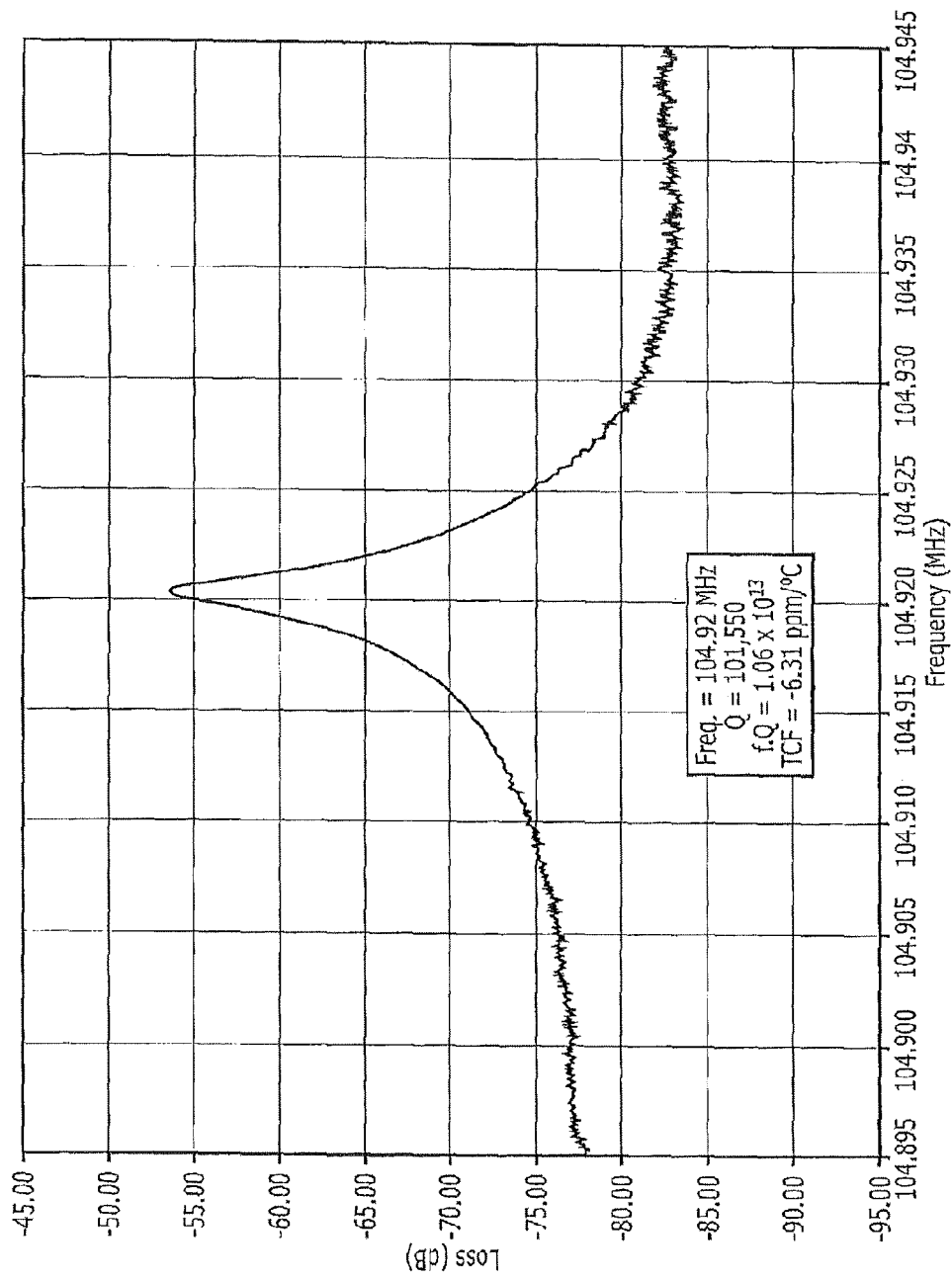
FIG. 4 is a graph that illustrates loss (dB) versus frequency for the CBAR of FIG. 2A (in vacuum).
Figure 5D:
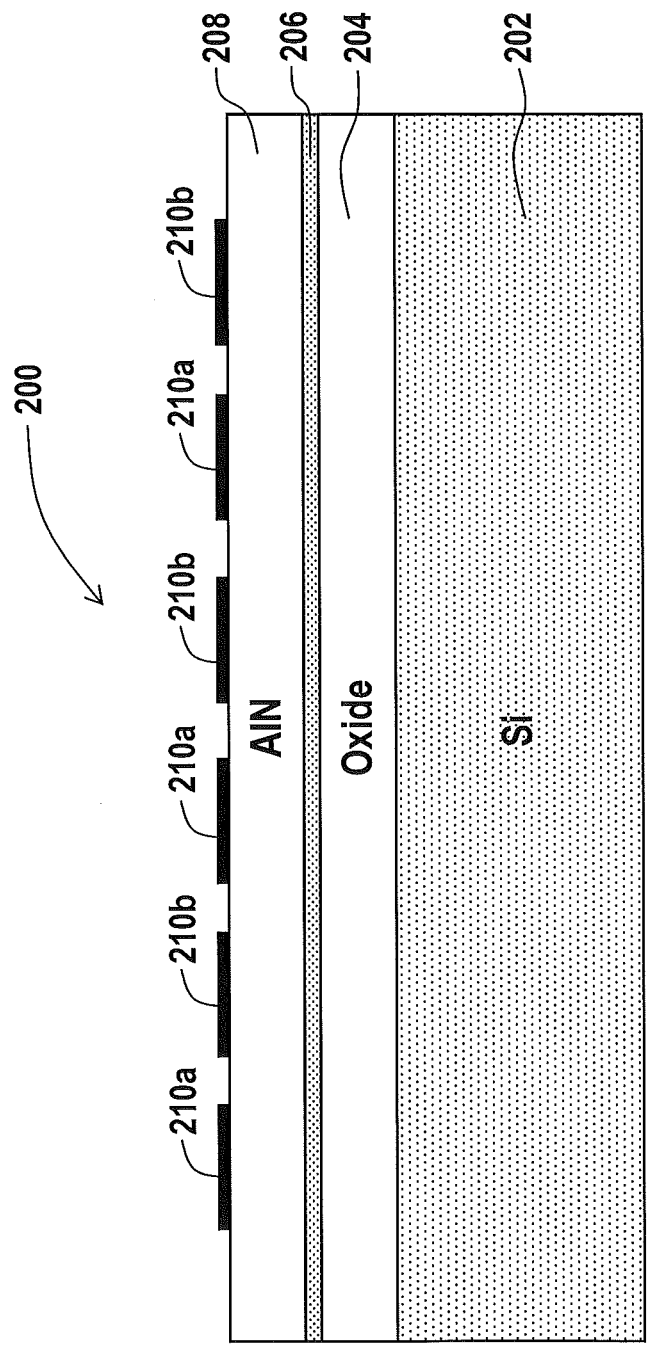
FIG. 5D is a cross-sectional view of a multi-mode resonator that may be utilized in the periodic signal generator of FIG. 5C, according to embodiments of the present invention.

Referring now to FIG. 5D, the MEMS resonators within the oscillator 102' of FIG. 5C may be configured as equivalent rectangular-shaped multi-mode resonators. These resonators may be independently controlled by circuitry to support both bulk acoustic wave and surface wave modes of operation at different resonance frequencies $f_1$, $f_2$ and with different temperature coefficients of frequency $TCf_1$, $TCf_2$, which may differ by at least about 5 ppm/° C. and, more preferably, by at least about 10 ppm/° C. As illustrated, the resonator 200 of FIG. 5D includes a semiconductor resonator body 202 (e.g., silicon body), a mode separation layer 204 on the resonator body 202, a bottom electrode 206 on the mode separation layer 204, a piezoelectric layer 208 (e.g., AlN layer) on the bottom electrode 206 and drive and sense electrodes 210a, 210b (e.g., molybdenum) with interdigitated fingers on the piezoelectric layer 208. A pitch between each of the fingers in the interdigitated drive and sense electrodes may be less than a thickness of the resonator body 202 and/or less than one-half a total thickness of the resonator 200. As will be understood by those skilled in the art and illustrated by FIGS. 2 and 4A of the aforementioned U.S. Pat. No. 7,800,282 and FIG. 2A of the aforementioned U.S. Pat. No. 7,843,284, this resonator 200 may be suspended opposite a recess within a semiconductor substrate using at least one pair of tethers.

According to some embodiments of the invention, the mode separation layer 204 includes a material having a temperature coefficient of frequency that is unequal to a temperature coefficient of frequency of the piezoelectric layer 208 and unequal to a temperature coefficient of frequency of the resonator body 202. For example, the mode separation layer 204 may be formed of a material such as silicon dioxide, which provides an additional temperature compensating effect to the resonator 200 by having an opposite TCF relative to the piezoelectric layer 208 and the resonator body 202. According to additional embodiments of the invention, the use of an upper oxide-based mode separation layer 204, which extends between an upper surface of the resonator body 202 and the piezoelectric layer 208, may have a significantly larger effect on the TCF associated with surface mode operation relative to the TCF associated with bulk mode operation. Moreover, the mode separation layer 204 may have a thickness sufficient to facilitate a relatively high-Q surface wave mode of operation adjacent an upper surface of the resonator 200 and may even provide sufficient temperature compensation to yield a TCF of less than about 2 ppm/° C. when the resonator is supporting the surface wave mode of operation. The use of an electrically insulating layer to provide bulk temperature compensation in a MEMS resonator is more fully described in commonly-assigned U.S. application Ser. No. 13/035,148 to Pan entitled "Methods of Forming Micro-Electromechanical Resonators Using Passive Temperature Compensation Techniques," filed Feb. 25, 2011 and Ser. No. 12/363,142 to Wang et al. entitled "Thin-Film Bulk Acoustic Resonators Having Reduced Susceptibility to Process-Induced Material Thickness Variations," filed Jan. 30, 2009, the disclosures of which are hereby incorporated herein by reference.

Figure 6B:
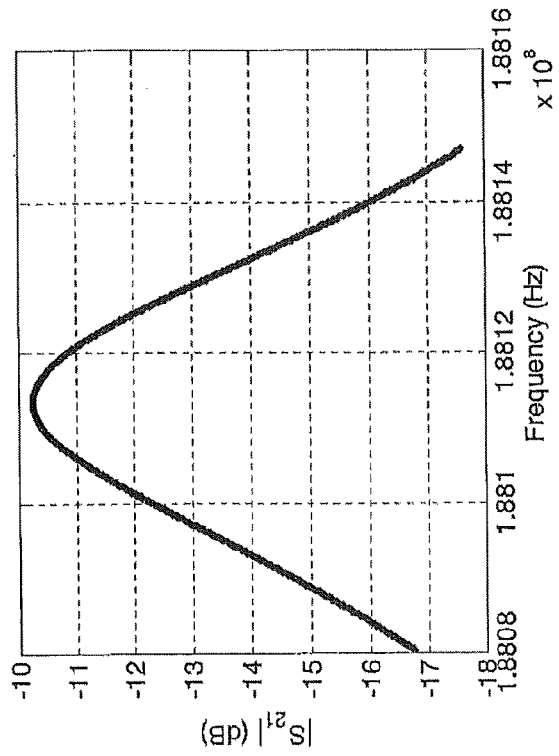
FIGS. 6A-6B are graphs that illustrate loss (dB) versus measured frequency of a resonator when operating at resonance in a bulk acoustic wave mode of operation (FIG. 6A) and in a surface wave mode of operation (FIG. 6B), in vacuum at 40° C., according to embodiments of the invention.
Figure 6A:
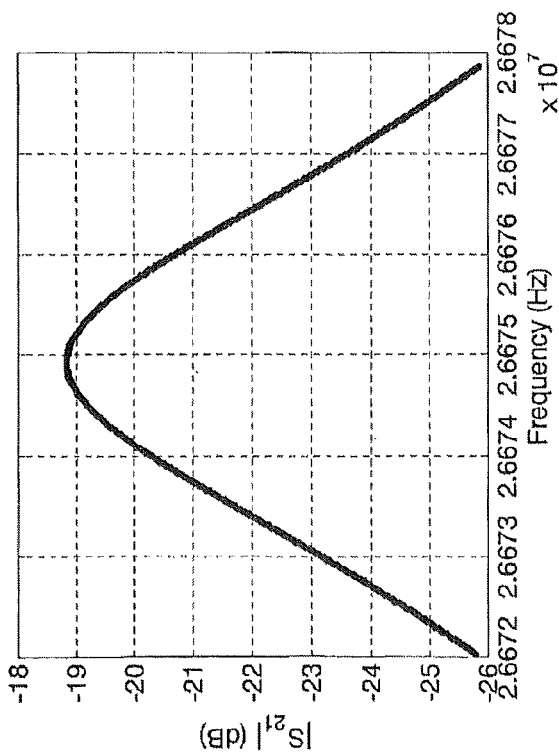

FIGS. 6A-6B illustrate resonance frequencies of a resonator embodiment having six pairs of fingers associated with the drive and second electrodes 210a, 210b, a finger-to-finger pitch of 13 µm, a finger spacing of 4 µm, an oxide mode separation layer 204 (grown oxide layer) having a thickness of 2 µm and a resonator body 202 having a thickness of about 29 µm, a length of 234 µm and a width of 156 µm. The bottom electrode 206, piezoelectric layer 208 and drive and sense electrodes 210a, 210b may be formed as a Mo/AlN/Mo stack having a thickness of 50/700/50 nm. As shown by FIGS. 6A-6B, the measured frequency of resonance of the resonator when driven to operate in bulk mode of operation is $f_1$=26.7 MHz with a $TCf_1$ of −21.9 ppm/° C. (with an insertion loss IL=18.8 dB and Q=9120) and the frequency of resonance of the same resonator when driven to operate in a surface mode of operation is $f_2$=188.1 MHz with a $TCf_2$ of −12.2 ppm/° C. (with an insertion loss IL=10.2 dB and Q=5629)

Figure 7:
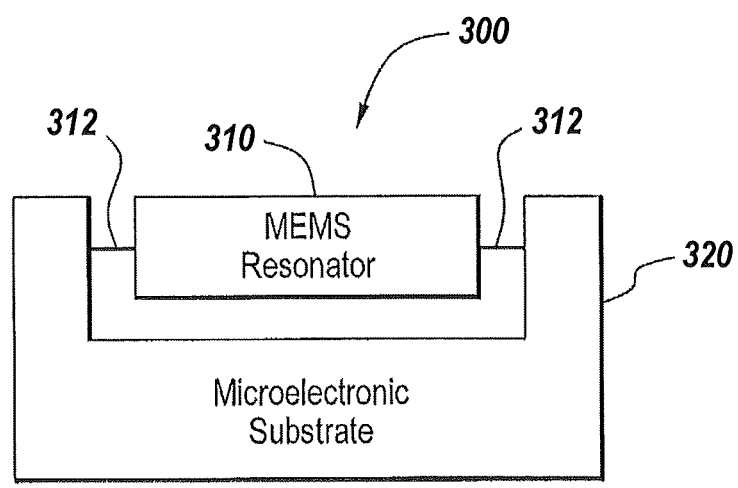
FIG. 7 is a cross-sectional view of a microelectromechanical device according to embodiments of the present invention.

FIG. 7 is a cross-sectional view of a microelectromechanical device 300 according to additional embodiments of the present invention. In these embodiments, the microelectromechanical device 300 includes a microelectronic substrate 320 and a resonator body 310, which is suspended from the microelectronic substrate 320 by a pair of tethers 312. As described more fully hereinbelow, the resonator body 310 may include relatively highly doped monocrystalline silicon having [100] and [110] crystallographic orientations that are misaligned to a nodal line (e.g., tether-to-tether axis) of the device 300. The microelectronic substrate 320 may be any substrate that is conventionally used to fabricate microelectronic devices, including single element substrates comprising single crystal silicon, compound substrates comprising, for example gallium arsenide, and multiple layer substrates including, for example silicon-on-insulator (SOI) substrates, nanocrystalline diamond-on-silicon, etc. In some of the embodiments of the invention, the microelectromechanical device 300 may be configured as a thin-film piezoelectric-onsemiconductor (TPoS) resonator. However, other MEMS-based resonators may be used.

Figure 8:
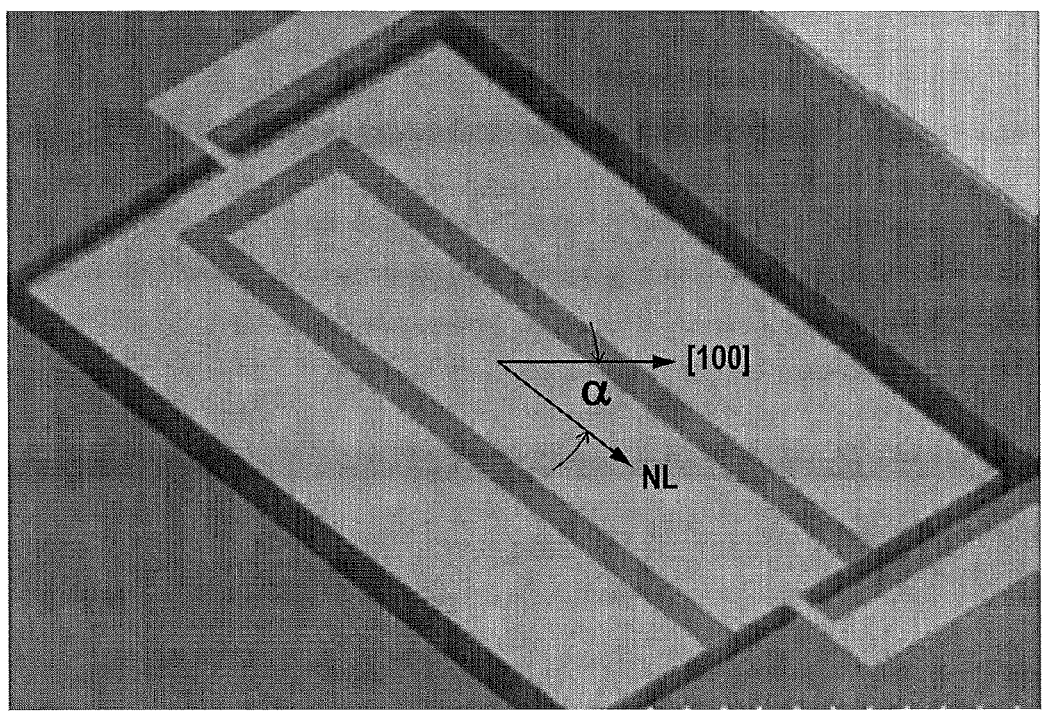
FIG. 8 is a scanning electron microscope (SEM) image of a TPoS resonator aligned to the [100] direction (i.e., a [100]-aligned resonator), according to an embodiment of the invention.
Figure 9:
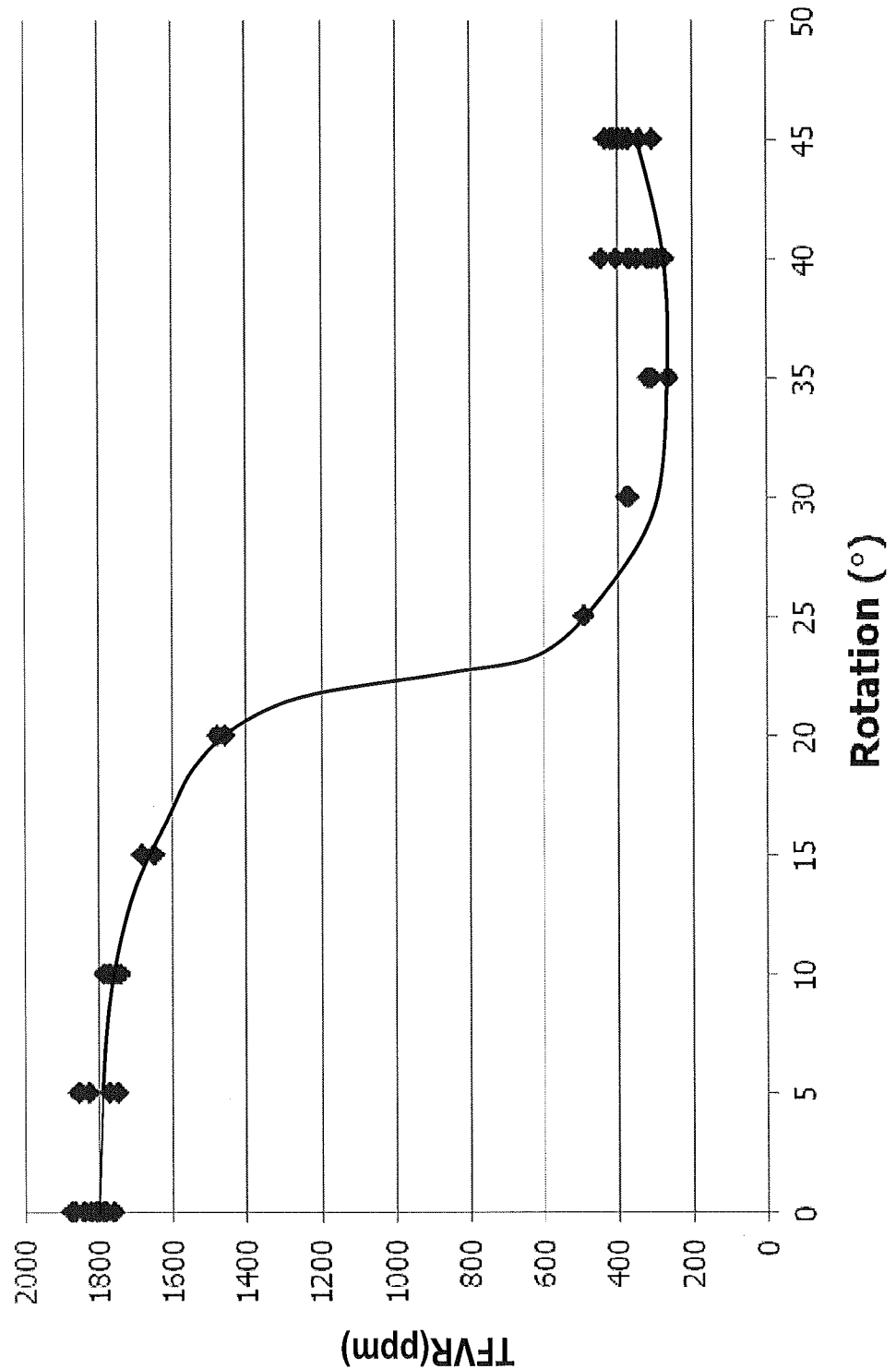
FIG. 9 is graph of total frequency variation range (TFVR) versus resonator alignment, according to embodiments of the present invention.

FIG. 8 is a scanning electron microscope (SEM) image of a TPoS resonator having a nodal line (NL) that is misaligned to the [100] direction by an angle equivalent to ±α degrees when the resonator is operating at a resonant frequency, where α is a real number in a range from about 5 to about 19 and, more preferably, in a range from about 7 to about 17. FIG. 9 is a graph of total frequency variation range (TFVR) (ppm) across a range of temperatures (from −40° C. to 90° C.), relative to rotation (i.e., relative to a [110] direction, which is offset from the [100] direction by 45 degrees), for 27 MHz resonators fabricated from monocrystalline silicon resonator bodies having a 0.001-0.003 ohm-cm resistivity, but having different lengths (142-154 um) and widths (180-230 um), with some resonator bodies having perforations located at center and λ/4 (where λ=2*length). As will be understood by those skilled in the art, a TFVR is determined by computing $(f_{max}-f_{min})/f_{avg}$ across a predetermined temperature range. This graph shows that rotation relative to the nodal line is the determining factor minimizing TFVR with the smallest TFVR obtained at about 35° relative to the [110] direction (i.e., 10° relative to the [100] direction). However, further reductions in TFVR for 27 MHz devices may be achieved by adding arrays of perforations to the resonator body (e.g., at device center and off-center).

Figures 10A, 10B:
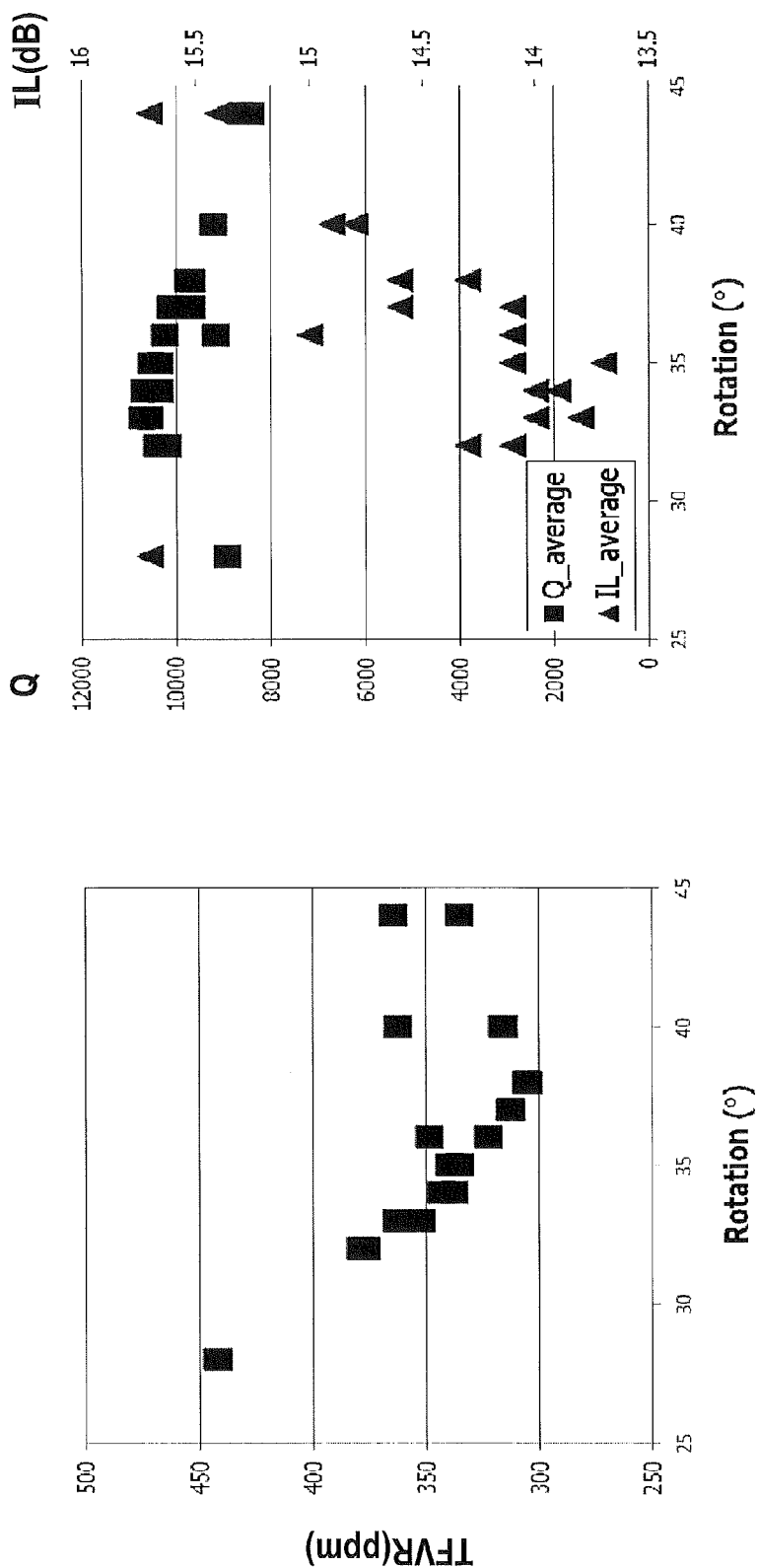
FIG. 10A is graph of total frequency variation range (TFVR) versus resonator alignment, according to embodiments of the present invention.
FIG. 10B is a graph of quality (Q) and insertion loss (IL) versus resonator alignment, according to embodiments of the present invention.
Figures 11A, 11B:
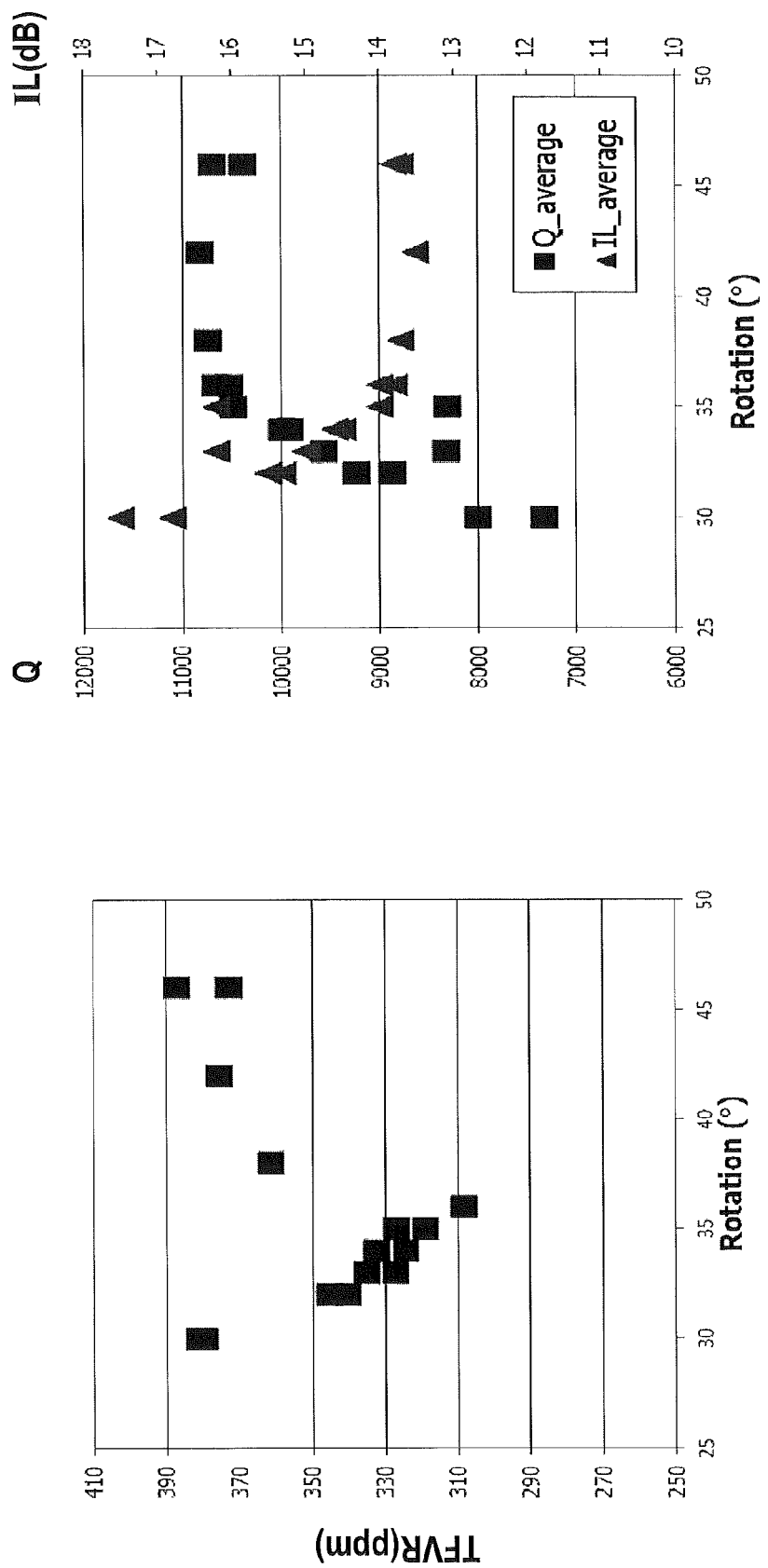
FIG. 11A is graph of total frequency variation range (TFVR) versus resonator alignment, according to embodiments of the present invention.
FIG. 11B is a graph of quality (Q) and insertion loss (IL) versus resonator alignment, according to embodiments of the present invention.

FIG. 10A is a graph of total TFVR (ppm) across temperatures from −40° C. to 90° C., relative to rotation (i.e., relative to a [110] direction), for 27 MHz resonators having a length of 142 um, a width of 180 um (with perforations) and a Mo/AlN/Mo/Si stack with thicknesses of 50 nm/700 nm/50 nm/20 um. FIGS. 10A-10B show that a smallest TFVR of about 300 ppm is achieved at a rotation of about 38°, with a corresponding Q of about 10,000 and an insertion loss (IL) of about 14-15 db. FIG. 11A is a graph of total TFVR (ppm) across temperatures from −40° C. to 90° C., relative to rotation (i.e., relative to a direction), for 27 MHz resonators having a length of 142 um, a width of 185 um (with three perforations) and a Mo/AlN/Mo/Si stack with thicknesses of 50 nm/700 nm/50 nm/20 um. The perforations include one at center and two at 71 um (from each side of center) along the tether-to-tether axis. FIGS. 11A-11B show that a smallest TFVR of about 300 ppm is achieved at a rotation of about 36°, with a corresponding Q greater than about 10,000 and an insertion loss (IL) of about 14 db. FIG. 12A is a graph of total TFVR (ppm) across temperatures from −40° C. to 90° C., relative to rotation (i.e., relative to a [110] direction), for 27 MHz resonators having a length of 142 um, a width of 190 um (with perforations) and a Mo/AlN/Mo/Si stack with thicknesses of 50 nm/700 nm/50 nm/20 um. The perforations include one at center and two at 71 um (from each side of center) along the tether-to-tether axis. FIGS. 12A-12B show that a smallest TFVR of about 320 ppm is achieved at a rotation of about 32°, with a corresponding Q of about 7,500 and an insertion loss (IL) of about 17 dB. FIG. 12B also shows that a best Q (>10,000) and lowest insertion loss (=13 dB) are achieved at a rotation of about 38-47°, with a somewhat higher TFVR of about 400 ppm.

Figure 13B:
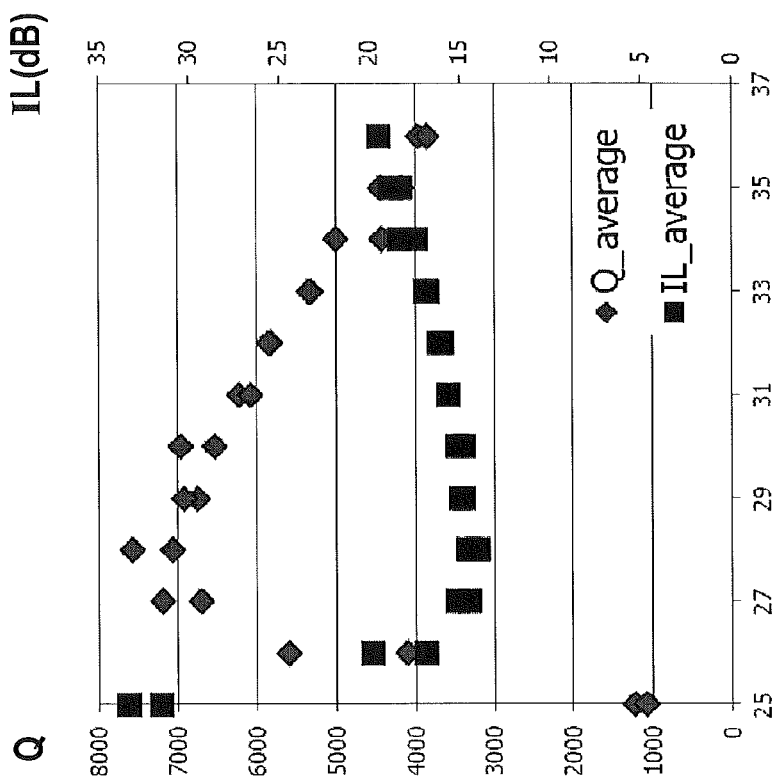
FIG. 13B is a graph of quality (Q) and insertion loss (IL) versus resonator alignment, according to embodiments of the present invention.
Figure 13A:
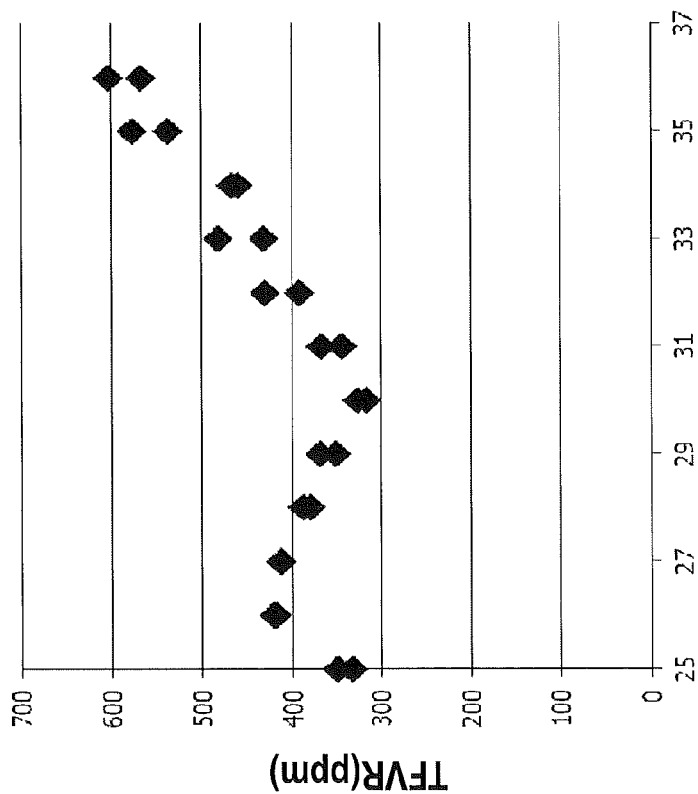
FIG. 13A is graph of total frequency variation range (TFVR) versus resonator alignment, according to embodiments of the present invention.

FIG. 13A is a graph of total TFVR (ppm) across temperatures from −40° C. to 90° C., relative to rotation (i.e., relative to a [110] direction), for $3^{rd}$ order 108 MHz resonators having a length of 108 um (3×36 um (electrode pitch)), a width of 115 um (without perforations) and a Mo/AlN/Mo/Si stack with thicknesses of 50 nm/700 nm/50 nm/20 um. FIGS. 13A-13B show that a smallest TFVR of about 300 ppm is achieved at a rotation of about 30°, with a corresponding Q of less than about 7,000 and an insertion loss (IL) of about 15 dB. FIG. 13B also shows that a best Q and insertion loss (IL) are achieved at a rotation of about 28°, with a TFVR of about 350 ppm.

Figures 14A, 14B:
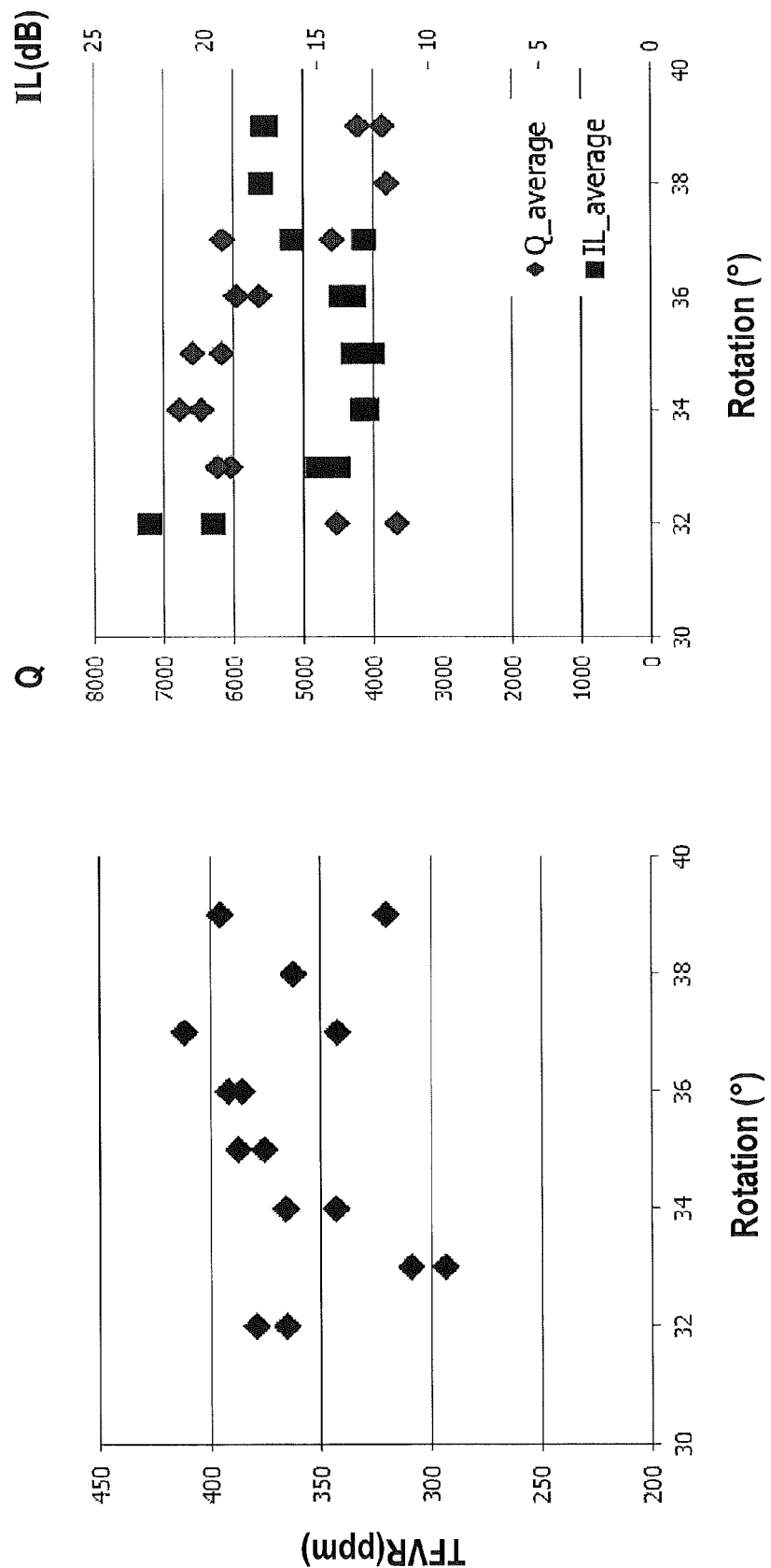
FIG. 14A is graph of total frequency variation range (TFVR) versus resonator alignment, according to embodiments of the present invention.
FIG. 14B is a graph of quality (Q) and insertion loss (IL) versus resonator alignment, according to embodiments of the present invention.
Figure 15B:
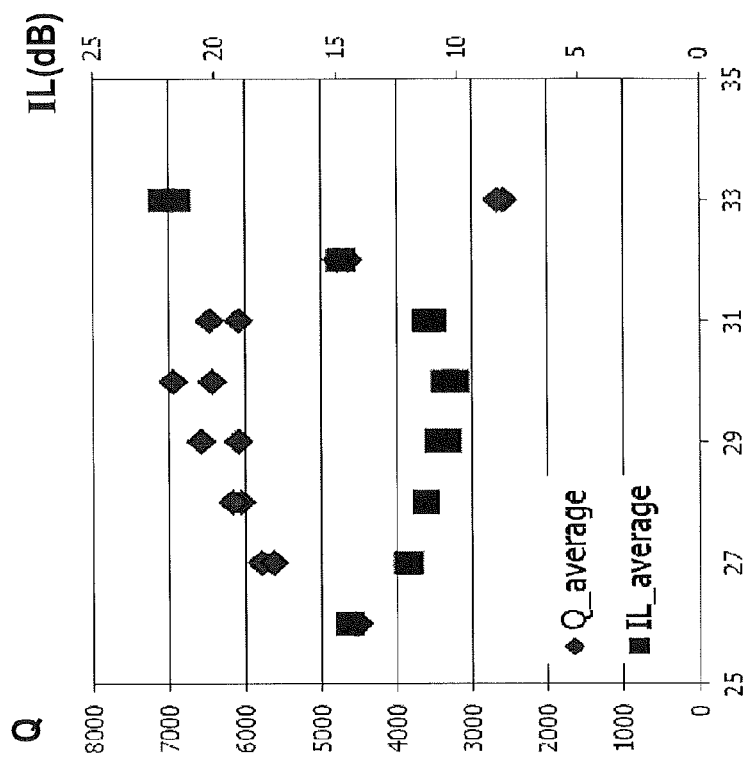
FIG. 15B is a graph of quality (Q) and insertion loss (IL) versus resonator alignment, according to embodiments of the present invention.
Figure 15A:
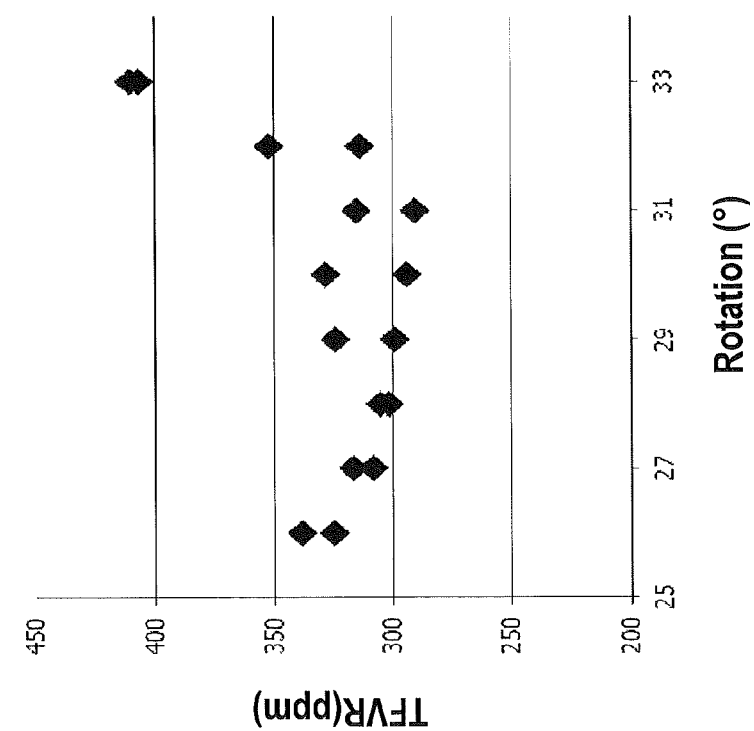
FIG. 15A is graph of total frequency variation range (TFVR) versus resonator alignment, according to embodiments of the present invention.

FIG. 14A is a graph of total TFVR (ppm) across temperatures from −40° C. to 90° C., relative to rotation (i.e., relative to a [110] direction), for 5th order 108 MHz resonators having a length of 175 um (5×35 um (electrode pitch)), a width of 170 um (with two columns of perforations near the edge of the resonator body) and a Mo/AlN/Mo/Si stack with thicknesses of 50 nm/700 nm/50 nm/20 um. FIGS. 14A-14B show that a smallest TFVR of about 300 ppm is achieved at a rotation of about 33°, with a corresponding Q of greater than about 6,000 and an insertion loss (IL) of about 15 dB. FIG. 14B also shows that a best Q of about 6500 and a lowest insertion loss (IL) of about 13 dB are achieved at a rotation of about 34°, with a TFVR of about 350 ppm. FIG. 15A is a graph of total TFVR (ppm) across temperatures from −40° C. to 90° C., relative to rotation (i.e., relative to a [110] direction), for 5th order 108 MHz resonators having a length of 175 um (5×35 um (electrode pitch)), a width of 170 um (with three columns of perforations) and a Mo/AlN/Mo/Si stack with thicknesses of 50 nm/700 nm/50 nm/20 um. FIGS. 15A-15B show that a smallest TFVR of about 300 ppm is achieved at a rotation of about 31°, with a corresponding Q of greater than about 6,000 and an insertion loss (IL) of about 11 dB. FIG. 14B also shows that a best Q and a lowest insertion loss are achieved at a rotation of about 30°.

Although not wishing to be bound by any theory, because the temperature coefficients and stiffness constants of silicon (i.e., $c_{11}$, $c_{12}$ and $c_{44}$) are dependent on doping levels, the resonance modes of resonators, which are dependent on such coefficients, can have both negative and positive TCFs depending on doping level. For example, as will be understood by those skilled in the art, the Young's modulus of silicon in the [100] direction may be related as: $E_{100}=(c_{11}-c_{12})(c_{11}+2c_{12})/(c_{11}+c_{12})$. Because of these properties, the alignment direction of resonator bodies having minimum overall frequency variation may be a function of how a specific resonance mode is determined by different stiffness constants. Moreover, because the length of the resonator body in the frequency-determining direction is a main factor for resonator performance, while the mode shape is dependent on width (in the non-frequency-determining direction) and/or perforation layout (if any), the quality (Q) and insertion loss (IL) will vary by design.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A thin-film piezoelectric-on-silicon (TPoS) resonator containing a single resonating element therein, comprising:
   a substrate; and
   a resonator body suspended over said substrate by at least a first pair of fixed tethers that attach to first and second ends of said resonator body, said resonator body comprising monocrystalline silicon having a [100] crystallographic orientation offset by ±α degrees relative to a nodal line of said resonator body when said resonator body is operating at a resonant frequency, where α is a real number in a range from about 5 to about 19 and has a value selected to generally passively minimize a total frequency variation range (TFVR) associated with the TPoS resonator when operating at the resonant frequency, and the nodal line corresponds to the tether-to-tether axis extending between the first and second ends of said resonator body.

2. The resonator of claim 1, wherein the resonator is an extensional-mode resonator; and wherein said resonator body is a rectangular-shaped resonator body having unequal length and width dimensions.

3. The resonator of claim 1, wherein said substrate is a [100] silicon-on-insulator substrate.

4. The resonator of claim 1, wherein the monocrystalline silicon in said resonator body is doped with an N-type or P-type dopant to a level greater than about $1 \times 10^{19}$ cm$^{-3}$.

5. The resonator of claim 1, wherein said resonator body has a thickness in a range from about 8 um to about 40 um.

6. The resonator of claim 1, further comprising lower and upper metal electrodes and an aluminum nitride layer on said resonator body, said aluminum nitride layer extending between the lower and upper metal electrodes.

\* \* \* \* \*